United States Patent [19]
Alpert et al.

[11] Patent Number: 6,044,209
[45] Date of Patent: Mar. 28, 2000

[54] METHOD AND SYSTEM FOR SEGMENTING WIRES PRIOR TO BUFFER INSERTION

[75] Inventors: Charles Jay Alpert, Pflugerville; Stephen Thomas Quay; Anirudh Devgan, both of Austin, all of Tex.

[73] Assignee: International Business Machines Corporation, Armonk, N.Y.

[21] Appl. No.: 08/929,509

[22] Filed: Sep. 15, 1997

[51] Int. Cl.$^7$ ..................................................... G06F 17/50
[52] U.S. Cl. ................................. 395/500.07; 395/500.06
[58] Field of Search ........................ 395/500.04, 500.06, 395/500.07, 500.11

[56] References Cited

U.S. PATENT DOCUMENTS

| | | |
|---|---|---|
| 5,305,229 | 4/1994 | Dhar . |
| 5,359,535 | 10/1994 | Djaja et al. . |
| 5,379,231 | 1/1995 | Pillage et al. . |
| 5,410,491 | 4/1995 | Minami . |
| 5,416,718 | 5/1995 | Yamazaki ................. 364/488 |
| 5,508,937 | 4/1996 | Abato et al. . |
| 5,519,351 | 5/1996 | Matsumoto . |
| 5,557,779 | 9/1996 | Minami . |
| 5,610,830 | 3/1997 | Ito et al. . |
| 5,638,291 | 6/1997 | Li et al. ................... 364/490 |
| 5,764,528 | 6/1998 | Nakamura ............... 364/489 |
| 5,799,170 | 8/1998 | Drumm et al. ........... 395/500 |
| 5,825,661 | 10/1998 | Drumm .................... 364/491 |
| 5,838,581 | 11/1998 | Kuroda ..................... 364/491 |
| 5,859,776 | 1/1999 | Sato et al. .............. 364/468.28 |
| 5,883,808 | 3/1999 | Kawarabayashi ........ 364/488 |

FOREIGN PATENT DOCUMENTS

| | | |
|---|---|---|
| 6-85646 | 3/1994 | Japan . |
| 7-86410 | 3/1995 | Japan . |

OTHER PUBLICATIONS

Alpert et al., "Wire Segmenting for Improved Buffer Insertion," DAC Jun. 1997, Anaheim, CA. No pg #, 1997.

Lukas Van Ginneken, "Buffer Placement in Distributed RC–Tree Networks for Minimal Elmore Delay", IBM, Thomas J. Watson Research Center, IEEE, 1990, pp. 865–868.

IBM Technical Disclosure Bulletin, "Allocating Maximum RC Delays to Guarantee Timing by Depth First Search", vol. 36, No. 09B, Sep. 1993, pp. 301–303.

IBM Technical Disclosure Bulletin, "Buffer Placement in Distributed RC Tree Networks for Minimal Elmore Delay", vol. 33, No. 8, Jan. 1991, pp. 338–341.

(List continued on next page.)

*Primary Examiner*—Kevin J. Teska
*Assistant Examiner*—Leigh Marie Garbowski
*Attorney, Agent, or Firm*—Casimer K. Salys; Andrew J. Dillon

[57] ABSTRACT

A method and system for segmenting wires in the design stage of a integrated circuit to allow for the efficient insertion of an optimum quantity of buffers. The method begins by locating wires in the integrated circuit which interconnect transistors and then determining the characteristics of the transistor and the characteristics of the interconnecting wires. Next, the method computes a first upper limit for an optimum quantity of buffers utilizing total capacitive load wire and transistor characteristics, then the method computes a second upper limit for an optimum quantity of buffers assuming buffer insertion has decoupled the capacitive load. Finally, the method segments the wires by inserting nodes utilizing the greater of the first computation or the second computation. A determined upper limit on buffer quantity allows wires to be segmented such that the number of candidate buffer insertion topologies is manageable. Therefore, an optimum number of buffers can be efficiently inserted by buffer insertion method which utilize the segmented wires.

20 Claims, 4 Drawing Sheets

OTHER PUBLICATIONS

Jorge Rubinstein, et al. "Signal Delay in RC Tree Networks", IEEE Transactions on Computer Aided Design, vol. CAD–2, No. 3, Jul. 1983, pp. 202–211.

John Lillis et al., "Optimal Wire Sizing and Buffer Insertion for Low Power and a Generalized Delay Model", IEEE Journal of Solid–State Circuits, vol. 31, No. 3, Mar. 1996, pp. 437–447.

IBM Technical Disclosure Bulletin, "Algorithm for Incremental Timing Analysis", vol. 38, No. 1, Jan. 1995; pp. 27–34.

Srinagesh Satyanarayana et al. "Resistive Interpolation Biasing: A Technique for Compensating Linear Variation in an Array of MOS Current Sources", IEEE Journal of Solid–State Circuits., vol. 30, No. 5, May 1995; pp. 595–596.

METHOD AND SYSTEM FOR SEGMENTING WIRES PRIOR TO BUFFER INSERTION

BACKGROUND OF THE INVENTION

1. Technical Field

The present invention relates in general to integrated circuit design methods and in particular to a design method for buffer insertion within integrated circuits. Still more particularly, the present invention relates to a method of optimal segmentation of circuits for improved buffer insertion.

2. Description of the Related Art

Often, transistors are utilized in digital logic circuits to supply or "drive" many other transistors with logic signals. If transistors require interconnection and they are not adjacent on an integrated circuit, then they are interconnected utilizing wires. When the distance from a driving transistor or "source" to a receiving transistor or "sink" becomes long enough to adversely effect the signal propagation time, the interconnecting wire can be referred to as a "long wire". The propagation delay of a signal, due to long wires and multiple sinks, can be reduced by "repowering" or relaying the signal utilizing simple amplifiers, called buffers.

A single source driving many sinks creates a "fanout" circuit. Fanout circuits are commonly referred to as a "tree structure" or a "fanout tree". A fanout tree has detrimental loading characteristics on a propagating signal, particularly when one "branch" of a fanout tree becomes more populated or more heavily loaded than another "branch".

The intermix of capacitance and resistance in a fanout tree creates a resistive-capacitive (RC) time constant which retards the propagation of a signal. A major factor in reduced propagation speed is the resistive effects of long wires in conjunction with transistor gate capacitance.

The resistance (r) of a wire increases linearly as a function of wire length (l) and, the resistivity (R) of the material utilized, where r=Rl. Likewise, the capacitance of a wire (c) increases linearly with its length (l) and associated physical properties. Capacitance can be defined by c=Cl. Therefore, the "RC" delay (D) of a wire due to resistance and capacitances is $D=1/2RCl^2$. As depicted by the $l^2$ term, the delay due to the capacitive and resistive effects increases quadratically with the length of a wire. As the scale of integrated circuits and clock speeds continues to increase, timing difficulties associated with wire lengths have become a vexing problem.

In designing an integrated circuit, the physical layout is accomplished in view of all the pertinent design constraints. Generally, after the layout or geographical planning of a semiconductor chip is complete, buffer insertion is then addressed or considered. Development of faster and larger integrated circuits has created the need for effective and efficient computer aided design (CAD) tools. The most desirable computer assistance comes in the form of calculations on circuits to identify potential problems such as unacceptable delays. An area of integrated circuit design which has received additional attention recently is the prediction of unacceptable delays in high frequency digital circuits. The rapid development of higher clock frequencies has intensified the effort to develop CAD assistance.

In digital circuits, fanout trees having more than five sinks are common. Although each sink has a relatively small RC time constant, the cumulative effect of many sinks can create excessive delays. Propagation delays caused by excessive wire length can be reduced to a substantially linear relationship by introducing buffers at strategic intervals. Currently, designers of digital circuits are striving for clock frequency of one giga-hertz. Therefore, implementation of an optimum buffer topology in tree structures has become critical to minimize delays. Rapid advances in transistor technology have reduced delay problems associated with transistors switching, but the wires interconnecting the transistors have become the limiting factor for implementing increased clock speeds.

Accurate computing of a propagation delay within a wiring tree is difficult because it requires a solution for a set of differential equations. The set of differential equations arise from distributed RC combinations. For optimum solutions, variables such as wire size are altered, then the delay is recalculated. However, optimization can be very time consuming. Deriving estimates for circuit delay, by making assumptions for certain variables can be a more economical approach.

Many CAD delay calculations utilize the "Elmore" delay model. The Elmore delay model is named after the works of W. C. Elmore. The basis of the Elmore model can be found in an article entitled "The Transient Response of Damped Linear Networks with Particular Regard to Wide-Band Amplifiers," W. C. Elmore J. Appl. Phys., vol. 1, no 1, pp. 55–63, January 1948. The Elmore model has been utilized extensively for buffer insertion design aid because it is conducive to utilizing a hierarchical algorithm. A popular Elmore model utilizes a hierarchical algorithm which follows a general two phase bottom-up prediction and top-down decision approach. Another important factor in utilizing the Elmore model, is that the complexity of computing the number of possible buffer positions is linear and therefore the calculation can be performed efficiently. The Elmore delay theory has been widely utilized by CAD developers for computer aided insertion of buffers into circuits.

For example, "Buffer Placement in Distributed RC-Tree Networks for Minimal Elmore Delay", by L. P. P. P. van Ginneken, Proc. Internxl Symposium on Circuits and Systems, 1990, pp. 865–868, proposed a solution for buffer insertion to minimize delay. Van Ginneken's method is severely limited because only one buffer can be placed on a single wire. This leads to solutions which have an inadequate quantity of buffers in most designs. For example, a fanout tree which requires three buffers for optimum performance will receive only one buffer utilizing van Ginneken's methods. Further, the device library of van Ginneken's proposal includes only one non-inverting buffer. A single device library also severely limits the effectiveness of the van Ginneken method by limiting candidate solutions.

An attempt to enhance the approach taken by Elmore and van Ginneken was presented in "Optimal Wire Sizing and Buffer Insertion for Low Power and a Generalized Delay Model" by J. Lillis, C. -K. Chen and T. -T. Y. Lin, IEEE Journal of Solid State Circuits, 31(3), 1996, pp. 437–447. Here after referred to as Lillis. Lillis proposed subdividing wires into infinitesimally small segments. This approach allows an infinite number of buffer insertion topologies or solutions to be considered because a large quantity of buffers can be inserted on a given wire.

Lillis proposed many improvements to van Ginneken's approach, adding the functionalities of wire sizing, a non-unit buffer library and inverting buffers. The Lillis approach also incorporated slew into the gate delay calculation. Lillis subdivided wires into infinitesimally small segments to overcome the onerous problem of van Ginneken that only one buffer can be inserted on each wire. However, in utilizing the Lillis method, the processing speed for each wire becomes inordinately slow due to the endless topologies which must be considered by the CAD system. Therefore, the processing speed utilizing the Lillis method, on a given tree is too slow and inefficient for most applications. However, the Lillis approach provides many enhancements and an improved solution to the van Ginneken method. Again, the Lillis' model is too slow and inefficient for most applications.

Generally, in the design of integrated circuits, a proposed layout, a proposed change, or a design iteration requires a timing analysis or a timing reevaluation. A twenty minute computation for a CAD system to verify proper operation after a proposed change, renders a program unacceptable to most designers. For example, the approach of Lillis could take several days to process 10,000 fanout trees. On a modern integrated circuit, such as a microprocessor, implementing 10,000 fanout trees in the design of an integrated circuit is not uncommon.

Circuits having large RC time constraints require multiple buffers to effectively decouple the RC load. Judicious insertion of buffers into a single circuit path having critical timing can improve the timing performance of a circuit by several nano-seconds. As integrated circuits become larger and chip area becomes cheaper, high frequency operation has been the focus of integrated circuit designers. Efforts to increase the clock speeds of digital circuits have revealed the importance of automated buffer insertion tools. Automating buffer insertion with the aid of the computer saves the designer many weeks of tedious work. Timely computation of optimum buffer insertion is also required to evaluate design tradeoffs. Hence, finding the optimum number of buffers efficiently, is desirable and advantageous. Both efficiency and effectiveness are essential in a useful buffer insertion design tool.

Hence, there is a need for an effective and efficient design tool for efficiently and effectively segmenting wires prior to buffer insertion. The present invention is directed at solving the inefficiency and ineffectiveness of available buffer insertion design tools.

SUMMARY OF THE INVENTION

It is therefore one object of the present invention to provide an effective and efficient buffer estimate method for use in integrated circuit design.

It is another object of the present invention to provide an automated buffer insertion method which will determine an optimum number of wire segments prior to buffer insertion in an integrated circuit design.

It is yet another object of the present invention to provide an automated buffer insertion method which can effectively and efficiently evaluate design trade-offs in an integrated circuit design.

The foregoing objects are achieved as is now described. A method and system for segmenting wires in the design stage of a integrated circuit to allow for the efficient insertion of an optimum quantity of buffers. The method begins by locating wires in the integrated circuit which interconnect transistors and then determining the characteristics of the transistor and the characteristics of the interconnecting wires. Next, the method computes a first upper limit for an optimum quantity of buffers utilizing total capacitive load wire and transistor characteristics, then the method computes a second upper limit for an optimum quantity of buffers assuming buffer insertion has decoupled the capacitive load. Finally, the method segments the wires by inserting nodes utilizing the greater of the first computation or the second computation. A determined upper limit on buffer quantity allows wires to be segmented such that the number of candidate buffer insertion topologies is manageable. Therefore, an optimum number of buffers can be efficiently inserted by a buffer insertion method which utilizes the segmented wires.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
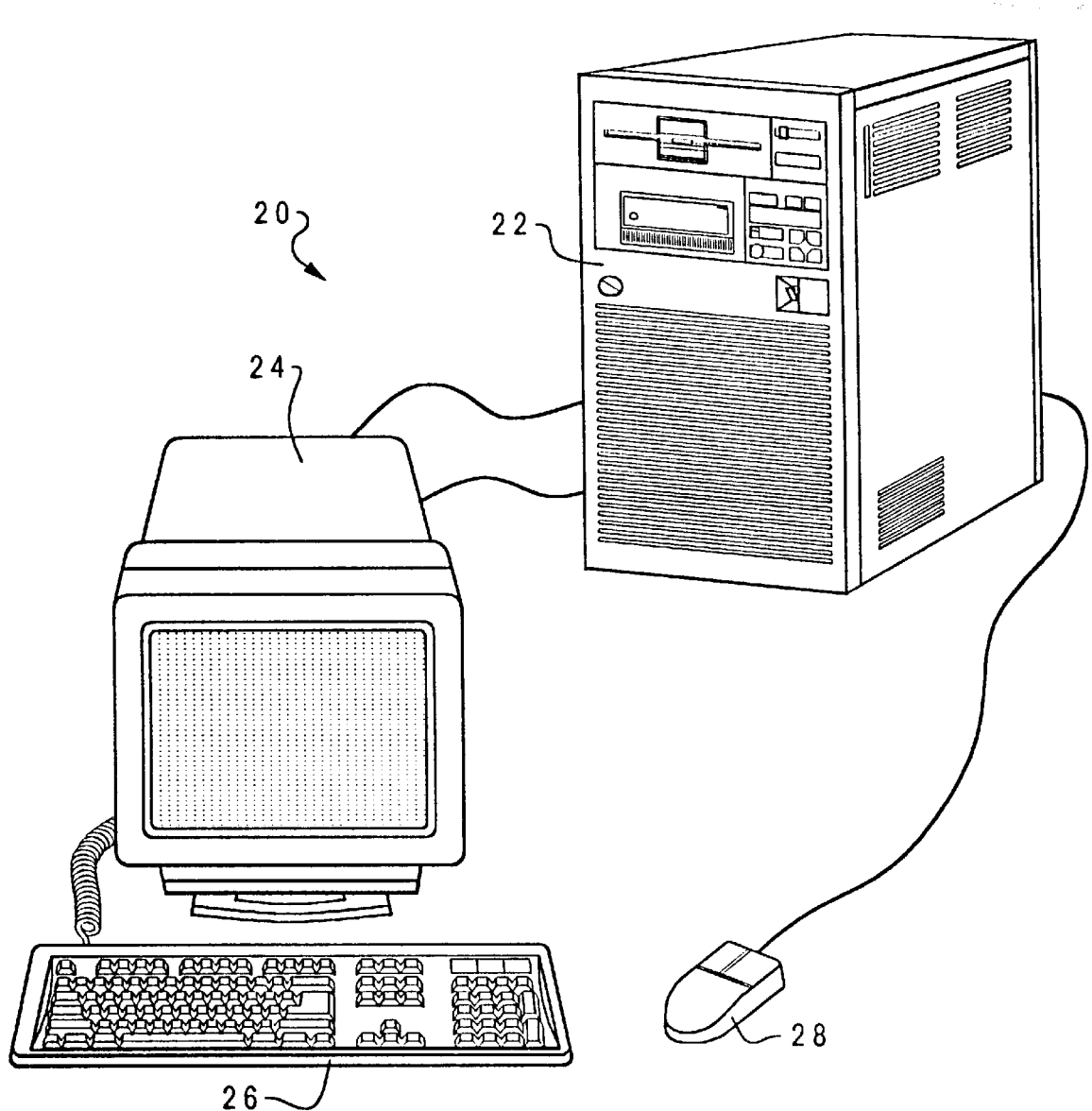
FIG. 1 illustrates a pictorial representation of a computer system which may be utilized to implement a preferred embodiment of the present invention.

With reference now to the figures and in particular with reference to FIG. 1, there is depicted a pictorial representation of a computer system which may be utilized to implement a preferred embodiment of the present invention. A computer system 20 is depicted that includes a system unit 22, a video display terminal 24, a keyboard 26, and a mouse 28. Keyboard 26 is that part of computer system 20 that resembles a typewriter keyboard and enables a user to control particular aspects of the computer. Because information flows in one direction, from keyboard 26 to system unit 22, keyboard 26 functions as an input-only device. Functionally, keyboard 26 represents half of a complete input/output device, the output half being video display terminal 24. Keyboard 26 includes a standard set of printable characters presented in a QWERTY pattern typical of most typewriters. In addition, keyboard 26 includes a calculator-like numeric keypad at one side. Some of these keys, such as the "control," "alt," and "shift" keys can be utilized to change the meaning of another key. Other special keys and combinations of keys can be utilized to control program operations or to move either text or cursor on the display screen of video display terminal 24.

Figure 2:
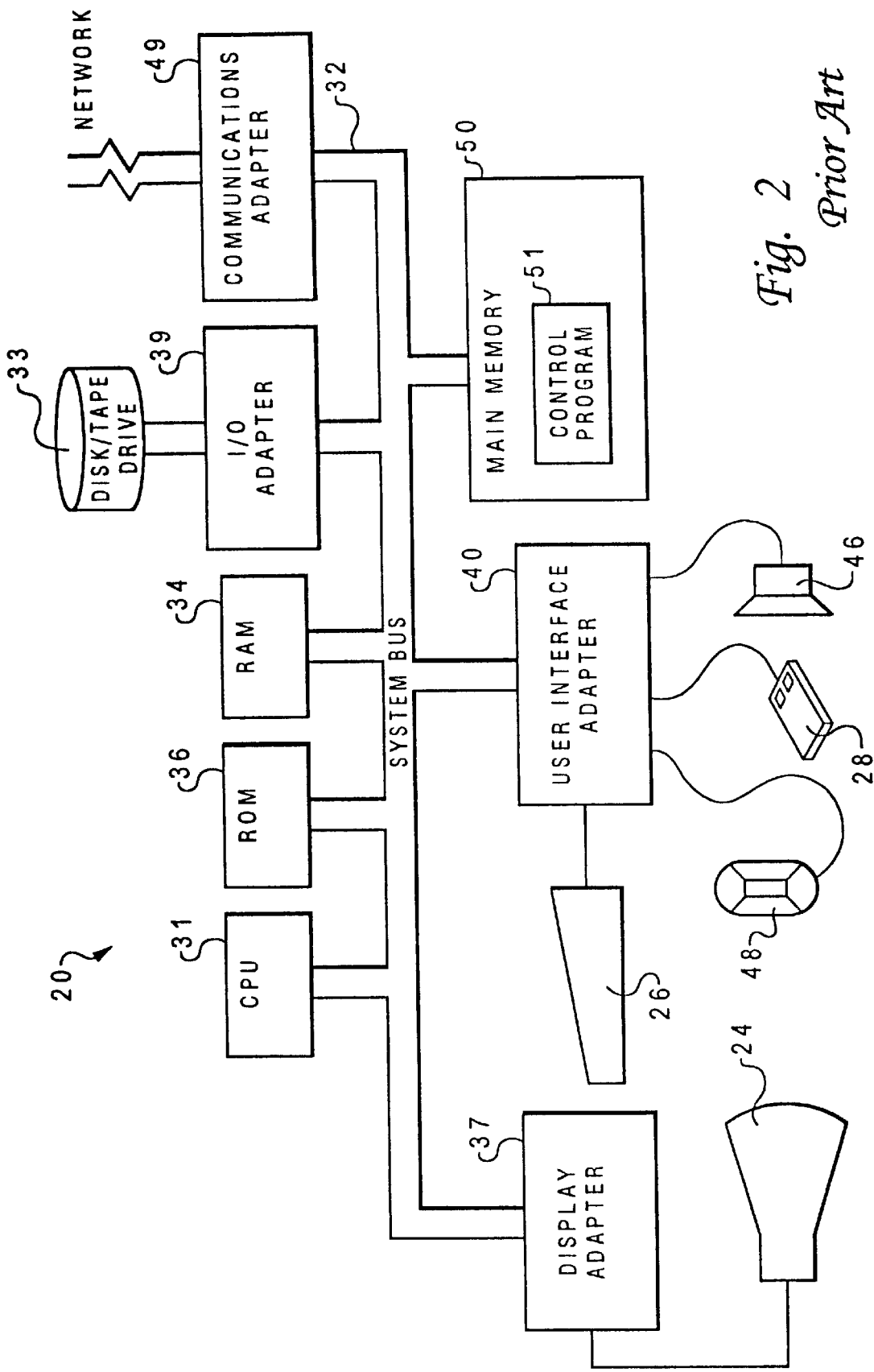
FIG. 2 depicts a representative hardware environment of the computer system illustrated in FIG. 1 in accordance with the present invention.

Computer system 20 can be implemented utilizing any suitable hardware. In a preferred embodiment, the present invention is implemented on a computer which utilizes the UNIX operating system. UNIX is a trademark of UNIX Systems Laboratories, Inc. A computer such as the IBM-RS6000/390, a product of International Business Machines Corporation, located in Armonk, N.Y., is well suited for implementation of the present invention. However, those skilled in the art will appreciate that a preferred embodiment of the present invention can apply to any computer system, regardless of whether the computer system is a simple single user non-UNIX system or a UNIX based multi-user computing apparatus. In FIG. 1 and FIG. 2, like parts are identified by like numbers. Computer system 20 is thus a configuration that includes all functional components of a computer and its associated hardware. In general, a typical computer system includes a console or system unit such as system unit 22, having one or more disk drives, a monitor such as video display terminal 24, and a keyboard such as keyboard 26. Additional hardware, often referred to in the art as peripheral devices, can include devices such as printers, modems, and joysticks.

FIG. 2 depicts a representative hardware environment of the computer system illustrated in FIG. 1. Computer system 20 includes a Central Processing Unit ("CPU") 31, such as a conventional microprocessor, and a number of other units interconnected via system bus 32. CPU 31 includes a portion of computer system 20 that controls the operation of the entire computer system, including executing the arithmetical and logical functions contained in a particular computer program. Although not depicted in FIG. 2, CPUs such as CPU 31 typically include a control unit that organizes data and program storage in a computer memory and transfers the data and other information between the various parts of the computer system. Such CPUs also generally include an arithmetic unit that executes the arithmetical and logical operations, such as addition, comparison, multiplications and so forth. Such components and units of computer system 20 can be implemented in a system unit such as system unit 22 of FIG. 1.

Computer system 20 further includes random-access memory (RAM) 34, read-only memory (ROM) 36, display adapter 37 for connecting system bus 32 to video display terminal 24, and I/O adapter 39 for connecting peripheral devices (e.g., disk and tape drives 33) to system bus 32. RAM 34 is a type of memory designed such that the location of data stored in it is independent of the content. Also, any location in RAM 34 can be accessed directly without having to work through from the beginning. ROM 36 is a type of memory that retains information permanently and in which the stored information cannot be altered by a program or normal operation of a computer.

Video display terminal 24 is the visual output of computer system 20. Video display terminal 24 can be a cathode-ray tube (CRT) based video display well-known in the art of computer hardware. However, with a portable or notebook-based computer, video display terminal 24 can be replaced with a liquid crystal display (LCD) based or gas plasma-based flat-panel display. Computer system 20 further includes user interface adapter 40 for connecting keyboard 26, mouse 28, speaker 46, microphone 48, and/or other user interface devices, such as a touch-screen device (not shown), to system bus 32. Communications adapter 49 connects computer system 20 to a computer network. Although computer system 20 is depicted to contain only a single CPU and a single system bus, it should be understood that the present invention applies equally to computer systems that have multiple CPUs and to computer systems that have multiple buses that each perform different functions in different ways.

Computer system 20 also includes an interface that resides within a machine-readable media to direct the operation of computer system 20. Any suitable machine-readable media may retain the interface, such as RAM 34, ROM 36, a magnetic diskette, magnetic tape, or optical disk (the last three being located in disk and tape drives 33). Any suitable operating system and associated interface (e.g., Microsoft Windows or UNIX) may direct CPU 31. Other technologies such as touch-screen technology or human voice control can also be utilized in conjunction with CPU 31. For example, the AIX operating system and AIXwindows windowing system can direct CPU 31. The AIX operating system is IBM's implementation of the UNIX operating system. Operating systems typically include computer software for controlling the allocation and utilization of hardware resources such as memory, CPU time, disk space, and peripheral devices. The operating system is the foundation upon which applications, such as word-processing, spreadsheet, and web browser programs are built.

Those skilled in the art will appreciate that the hardware depicted in FIG. 2 may vary for specific applications. For example, other peripheral devices such as optical disk media, audio adapters, or chip programming devices, such as PAL or EPROM programming devices well-known in the art of computer hardware and the like, may be utilized in addition to or in place of the hardware already depicted. In addition, main memory 50 is connected to system bus 32, and includes a control program 51. Control program 51 resides within main memory 50, and contains instructions that, when executed on CPU 31, carries out the operations depicted in the logic flowchart of FIG. 4. The computer program product also can be referred to as a program product. Control program 51 contains instructions that when executed on CPU 31 can carry out logical operations such as those operations depicted in the logic flow charts of FIG. 4.

It is important to note that, while the present invention has been (and will continue to be) described in the context of a fully functional computer system, those skilled in the art will appreciate that the present invention is capable of being distributed as a program product in a variety of forms, and that the present invention applies equally regardless of the particular type of signal-bearing media utilized to actually carry out the distribution. Examples of signal-bearing media include: recordable-type media, such as floppy disks, hard disk drives, and CD ROMs, and transmission-type media such as digital and analog communication links. Examples of transmission media include devices such as modems. Modems are communication devices that enable computers such as computer 20 depicted in FIG. 1 and FIG. 2 to transmit information over standard telephone lines.

Figure 3A:
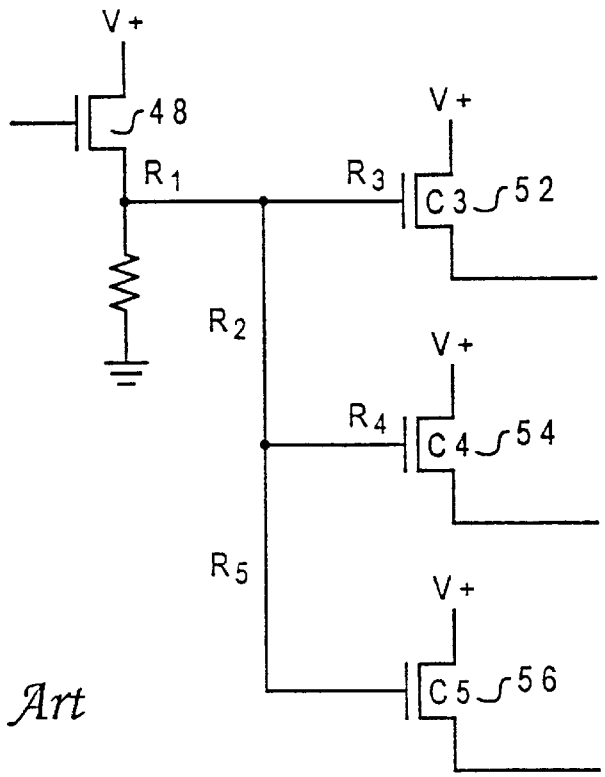
FIG. 3A depicts a fanout tree implemented with CMOS transistors in accordance with the present invention.
Figure 3B:
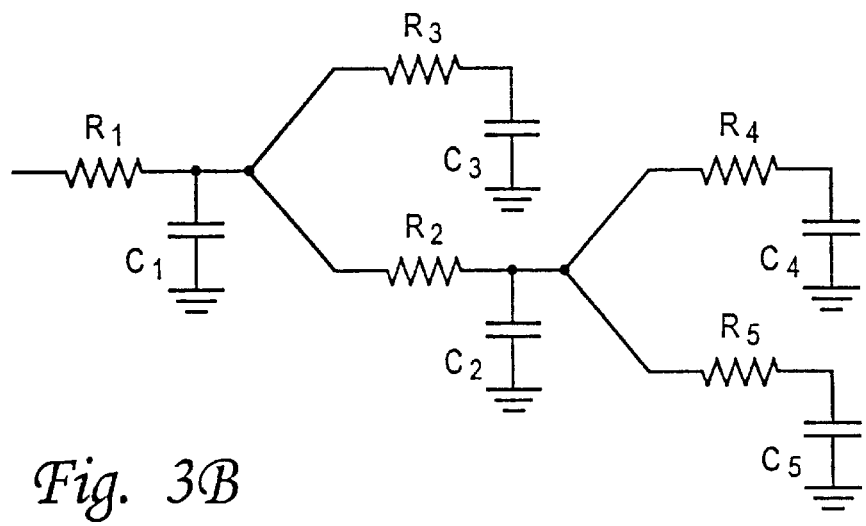
FIG. 3B depicts an equivalent electrical model of the fanout tree of FIG. 3A in accordance with the present invention.

FIG. 3A illustrates a typical fanout tree in accordance with the present invention. Typically, fanout trees distribute a logic signal from a single input of a source transistor 48 to a plurality of logic gates or sinks realized in FIG. 3A by transistors 52, 54, and 56. In FIG. 3B transistors and interconnecting wires of FIG. 3A are modeled by an effective resistance and an effective capacitance as depicted by R1–R5 and C1–C5.

FIG. 3B illustrates an Elmore Delay Model of the fanout tree depicted in FIG. 3A. The Elmore Delay Model allows utilization of a bottom up calculation. To determine the capacitances and resistances of FIG. 3B, a bottom up calculation would commence at transistor 56 of FIG. 3A, or at the furthest destination of the signal in a particular tree and moves towards the source of the signal, accumulating the equivalent resistance and capacitance of long wires and transistors 52 and 54. FIG. 3B depicts resistances R1–R5 as the resistance of wires and capacitances C1–C5 as the capacitance of transistors.

Figure 4:
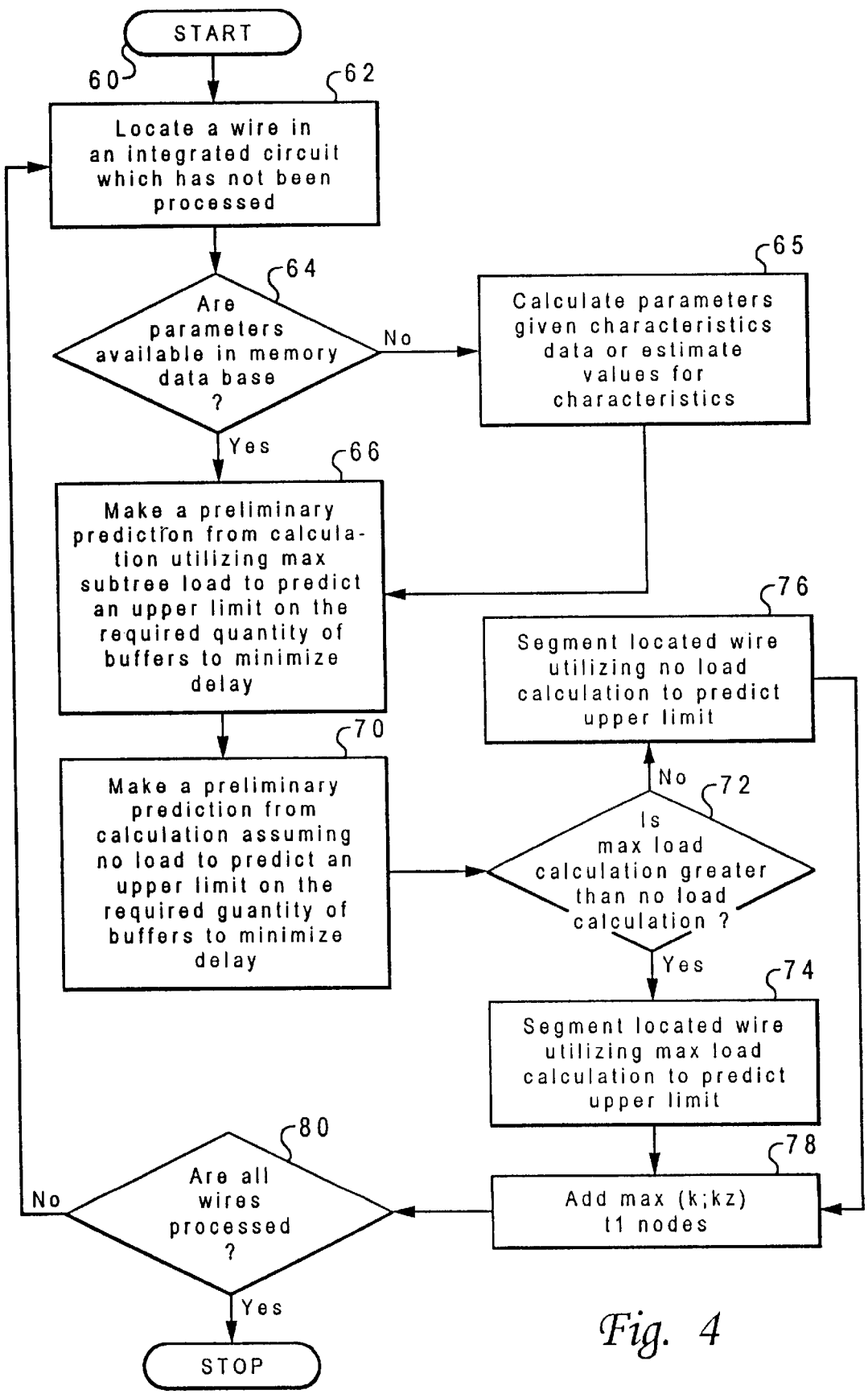
FIG. 4 illustrates a high level logic flow chart of a preferred embodiment in accordance with the present invention.

Referring now to FIG. 4 there is depicted a high level logic flowchart of the method utilized by the present invention to efficiently determine optimum segmenting of wires prior to buffer insertion. The o method is utilized by the operating system and computer system depicted in FIG. 1 and FIG. 2. As illustrated, the process begins at block 60 when the system input and output "I/O" alerts the operating system to start the wire segmentation method. The request may come from the human operator of the system or it may come from an automated request from a software routine which has created or modified a fanout tree.

In a preferred embodiment, after the completion of a design, the method sequentially searches each circuit within an integrated circuit to locate wires in a subtree which have not been processed by the present method as depicted in block 62.

In a preferred embodiment, a tree is identified and then subtrees of the identified tree are further examined. In alternate embodiments, any circuit structure can be identified for analysis. As depicted in block 64, after an unprocessed wire is identified, a search for the electrical parameters of the wire and transistors such as wire resistance and transistor capacitance is conducted in a database. The database may reside in the main memory of FIG. 2 or the database could reside in any signal storage media. If all parameters are located, a buffer quantity calculation is made utilizing the located parameters and a calculated total capacitive load, as depicted in block 66.

If the tree structure or its parameters are not available, the electrical characteristics can be approximated or calculated as in block 65. The computation in block 65 is performed given a database of known device dimensions and physical properties. For example, locating data about a wire such as material type, cross-sectional area and length, known basic electrical equations can be utilized to calculate the required parameters.

Each technology, such as bipolar or CMOS, which can be utilized to implement an integrated circuit or fanout tree has distinct attainable variables and parameters such as gate capacitance. Identification of the variables and parameters which constitute circuit characteristics is critical to an accurate calculation of the delay model. For example, a preferred embodiment might utilize thin gate CMOS logic, interconnected utilizing copper wires which have a cross sectional area of two microns.

In a preferred embodiment, to ensure accurate calculations, an electrical characteristic data base representing the specific physical implementation of the circuit is utilized by the system defined in FIG. 1 and FIG. 2. However, in an alternate embodiment, optimum values for the electrical characteristics of the circuit implemented are not required and estimates can be utilized. Utilizing the Elmore delay model, and calculated parameters from block 65, an upper limit for a buffer quantity which will minimize delay can be determined.

Next, as depicted in block 66, a preliminary calculation to find an upper limit for the number of buffers which may be required to minimize propagation delay within a circuit is determined. The predicted upper limit for an optimum buffer quantity ($k_1$) is initially determined utilizing total capacitive load. For the total capacitive load calculation, the subtree at the end of the subject wire is essentially replaced by a single sink or load capacitance $C_{T(v)}$. $C_{T(v)}$ reflects the capacitance value equivalent to the combined capacitive loads as determined by the Elmore delay model.

As depicted in block 66, the preliminary load calculation is only utilized to predict an upper limit for a number of buffers which may be required for optimizing propagation speed. The prediction of block 66 limits the scope of buffer insertion methods and candidate topologies by containing the number of possible solutions which can be considered. As depicted in block 66, Equation 1 utilizes the computed total load capacitance $C_{T(v)}$ as follows;

$$k_1 = -1/2 + SQRT[1 + (2(RCl_e + R(C_b - C_{T(v)}) - C(R_b - R_{so}))^2 / RC(R_b C_b + K_b))] \quad \text{(EQ. 1)}$$

where $_e$ denotes a wire and $l_e$ denotes the length of the wire. Further $R = R_e/le$ or the resistance per unit length of the wire 1, and $C = C_e/l_e$ or the capacitance per unit length of the wire. $R_{so}$ is the output resistance of the source, $C_b$ is the capacitance of the buffer, $R_b$ is the resistance of the buffer, $K_b$ is the buffer delay associated with buffer insertion and $C_{T(v)}$ is the total load capacitance of the identified circuit.

Next, in block 70 the method proceeds to estimate an optimum number of buffers ($k_2$) assuming the capacitance load has been decoupled by buffer insertion. As depicted in Equation 2, buffer insertion decouples the subject wire from the total capacitance. Therefore, the $C_{T(v)}$ term is not present in Equation 2 as follows;

$$k_2 = -1/2 + SQRT[1 + (2(RCl_e + RC_b - C(R_b - R_{so}))^2 / RC(R_b C_b + K_b))] \quad \text{(Eq. 2)}.$$

The derivations of Equations 1 and 2 are contained in "Wire Segmenting for Improved Buffer Insertion" by Charles Alpert and Anirudh Devgan, presented at the 34th Design Automation Conference, June 1997. The contents of which are hereby incorporated by reference.

Next, the subject method selects the maximum from the set ($k_1$, $k_2$), utilizing Equations 1 and 2 as depicted in decision block 72. If the predicted upper limit of buffers is greater for Equation 1 than the predicted upper limit of buffers for Equation 2 (i.e. $k_1 > k_2$) then the prediction of Equation 1 is utilized to segment wires as depicted in block 74. However, if the solution to Equation 2 is greater than the solution to Equation 1, $k_2$ is utilized to segment the subject wire, as depicted in block 76. The wire is then segmented into max of ($k_1, k_2$)+1 segments as depicted in block 78 by the insertion of nodes. The insertion of one buffer would require two wire segments. A first segment from the source to the buffer and a second segment from the buffer to the destination. Thus, one buffer requires two segments and two buffers require three segments, et cetera. Having segmented the wires, methods such that of van Ginneken and Lillis can effectively and efficiently be implemented.

Block 80 illustrates a determination of whether or not all wires or circuits have been identified and segmented and, if not, the process returns to block 62 in an interactive fashion. Buffer insertion can be implemented after each circuit segmentation has been completed or after all wires have been segmented.

The present method will locate wires and estimate an ample quantity of buffers which, if inserted, will adequately reduce delays within a subtree. The present invention segments wires by placing nodes between the end point of the selected wires so that the segmented wires can be utilized by known buffer insertion systems. After judicious node insertion, efficient processing by a buffer insertion methods such as the van Ginneken and Lillis method can be achieved. The quantity of nodes or wires is a critical variable for efficient buffer insertion. Adequate segmentation overcomes the one buffer per wire limitation of existing buffer insertion CAD systems. The segmentation calculations of the present invention offer an optimized partitioning of wires which have a high probability of timing difficulties.

The present invention and method performs long wire segmentation prior to proposing and determining candidate buffer insertion solutions. Segmentation allows buffer insertion methods to find optimum topologies without the added variable of buffer quantity. The present method does not require buffer insertion methods to install the predicted amount of buffers. The present method only limits the number of topologies, which buffer methods will consider.

Buffer insertion into a fanout tree such as that of FIG. 3A is performed efficiently by the method of van Ginneken and Lillis. The method entitled "Buffer Placement in Distributed networks for minimum Elmore Delay" and "Optimal Wire Sizing and Buffer Insertion for Low Power and a Generalized Delay Model," referred to herein is hereby incorporated by reference.

The method of the present invention will work with a fanout tree which has only one wire and a buffer library having only one buffer. Varying tree solutions which implement multiple buffer libraries and topologies, can adversely effect the accuracy of the present invention. However, the present method predicts the number of buffers which will minimize delay as closely as possible, while preferring to err on the side of over estimation.

For any given design, the number of buffer types in a buffer library is a constant. The complexity of the subject method is $O(n|B|)$, assuming that the buffer library is a constant. The complexity of the subject method and CAD run time of the present invention is nominal compared to buffer insertion methods. Methods such as Lillis and van Ginneken are of $O(n^2|B|^2)$ complexity, requiring considerably more time to process a fanout tree than the present invention.

In a preferred embodiment, the method of the present invention has been implemented in C++ on an IBM RS6000/390. In a preferred embodiment, a multiplier is added to the equation of block 72, thus the buffer insertion quantity is determined by $k=(M)\times\max(k, k_1, k_2)$, where $M \geq 0$. M is a parameter utilized to test various degrees of wire segmenting. Thus, when M=0, no wire segmenting can be achieved. When M=1 the above mentioned wire segmenting scheme is achieved. In general, as M increases, the buffer insertion quantity becomes closer to optimal since the number of possible locations for buffer insertion increases. Setting M equal to 30, can easily exceed the memory capacity of the computer system conducting the buffer estimation.

If M is too large, the separation between adjacent available locations also becomes marginal. M=30 is a sufficiently large value to be labeled as "optimal". Utilizing M=1 normally yields solutions that is within a few percent of optimal. Summarizing, M=1 utilizes significantly less CAD system processing time than M=30, while providing adequate results.

In a preferred embodiment, the subject method has a buffer library or database referred to in block 64 which consists of 9 inverting and 3 non-inverting buffers. The intrinsic delays for the buffers range from 6.83–120 ps, the resistance for the buffers range from 0.044 to 0.752 Ω, and the input capacitance of the buffers ranges from 31.8–488 fF. Sinks nominally have a capacitances which range from 10–500 fF. The intrinsic delays of the drivers or sources ranges from 32–37 ps and the output resistance of the drive range from 0.077–1.26 Ω respectively.

Summarizing, the method of the present invention accepts an unbuffered tree and a buffer library as inputs and returns a modified tree having segmented wires. Block 64 computes the total load capacitance, assuming no buffers, by recursively propagating sink capacitances up the tree. Block 66 predicts the number of buffers which will sufficiently minimize delay utilizing the total load capacitance. Block 70 predicts the optimum number of buffers assuming that buffer insertion has decoupled the total capacitance $C_{T(v)}$. Block 72 determines the largest value calculated from block 66 or 70 for k. In block 72 the highest calculated value for k is a prediction for the number of buffers that are needed to maximize propagation speed in a given topology. Block 78 creates nodes on the subject wire in response to the predetermined buffer quantity.

Creation of nodes in addition to the segmentation nodes can be utilized to allow buffer insertion just prior to each created node. In this case, zero length wires are added between the additional node and the segmentation node. A zero length wire is created to allow buffer insertion between the end points of a newly segmented wire, so that it is not at the end point. Confusion can result when a buffer is inserted at a node which is the intersection of two wires. In this case, the CAD system operator cannot determine which wire the buffer lies on. The length of the "zero" wire is set to a nominal length to satisfy minimum gate spacing requirements. Block 80 ensures the subject method iterates through all the wires.

The subject segmenting method computes delay for both load capacitance and no load capacitance and then utilizes the calculation which yields the higher value. Buffer insertion for each segmented wire of the present method is not necessary and buffer insertion methods may not insert buffer for each available segment. The cost of underestimating the optimum number of buffers is an inferior solution, while the cost of over estimation is additional processing time of the CAD system.

While the invention has been particularly shown and described with reference to a preferred embodiment, it will be understood by those skilled in the art that various changes in form and detail may be made therein without departing from the spirit and scope of the invention.

What is claimed is:

1. An efficient method for segmenting wires to achieve efficient buffer insertion during the design of an integrated circuit said method comprising:

locating wires in a predetermined circuit, said wires interconnecting semiconductor components on an integrated circuit, said wires having electrical characteristics and said semiconductor components having electrical characteristics;

computing a first buffer insertion quantity utilizing said electrical characteristics of said wires, said electrical characteristics of said semiconductor components and a total capacitive load of said wires;

computing a second buffer insertion quantity utilizing said electrical characteristics of said wire and said electrical characteristics of said semiconductor components; and segmenting said wires by inserting a quantity of nodes, wherein said quantity of nodes is determined by the greater of said first buffer insertion quantity or said second buffer insertion quantity.

2. The method of segmenting wires according to claim 1, wherein said semiconductor components are transistors.

3. The method of segmenting wires according to claim 1, wherein said wires and said semiconductor components comprise a fanout tree.

4. The method of segmenting wires according to claim 3, wherein said wires and said transistors comprise a fanout tree.

5. The method of segmenting wires according to claim 3, wherein said fanout tree implements CMOS logic.

6. The method of segmenting wires according to claim 1, wherein said wires are segmented to allow buffer insertion prior to the insertion of each node.

7. The method of segmenting wires according to claim 1, wherein a scaling factor is utilized to adjust said quantity of nodes.

8. The method of segmenting wires according to claim 1, wherein said electrical characteristics are comprised of resistance and capacitance, wherein said characteristics are calculated utilizing predetermined materials and predetermined physical dimensions.

9. A data processing system for segmenting wires to achieve efficient buffer insertion during the design of an integrated circuit said system comprising:

a storage media;

means for locating wires in a predetermined circuit, said wires interconnecting semiconductor components on an integrated circuit, said wires having electrical characteristics and said semiconductor components having electrical characteristics, said storage media for storing said electrical characteristics of said wires and said electrical characteristics of said semiconductor components;

means for computing a first buffer insertion quantity utilizing said electrical characteristics of said wires, said electrical characteristics of said semiconductor components and a total capacitive load;

means for computing a second buffer insertion quantity utilizing said electrical characteristics of said wire and said electrical characteristics of said semiconductor components; and means for segmenting said wires using a quantity of nodes, said quantity of nodes further being determined by the greater of said first buffer insertion quantity or said second buffer insertion quantity.

10. The system for segmenting wires according to claim 9, wherein said wire and said semiconductor components have a predetermined resistance and a predetermined capacitance.

11. The system for segmenting wires according to claim 9, wherein a resistance of said wire and a capacitance of said semiconductor components is calculated utilizing predetermined electrical characteristics and predetermined physical dimensions.

12. A data processing system according to claim 9, wherein a scaling factor is utilized to adjust said quantity of nodes.

13. The system for segmenting wires according to claim 9, wherein semiconductor components comprise transistors.

14. The system for segmenting wires according to claim 9, wherein said wires and said semiconductor components comprise a fanout tree.

15. A computer program product stored in signal bearing media in a computer aided integrated circuit design system for segmenting wires prior to buffer insertion said computer program product comprising:

instruction means stored in signal bearing media for causing a computer aided design system to select a wire from a plurality of wires, said wires having electrical characteristics, and said wires interconnecting a plurality of semiconductor components, said semiconductor components having electrical characteristics;

instruction means stored in signal bearing media for further causing said computer aided design system to compute a first buffer insertion quantity utilizing said electrical characteristics of said wires, said electrical characteristics of said semiconductor components and a total capacitive load;

instruction means stored in signal bearing media for additionally causing said computer aided design system to compute a second buffer insertion quantity utilizing said electrical characteristics of said wire and said electrical characteristics of said semiconductor components; and instruction means stored in signal bearing media for further causing said computer aided design to segment said wires, using a quantity of nodes, wherein said quantity of nodes is determined by the greater of said first buffer insertion quantity or said second buffer insertion quantity.

16. The computer program product according to claim 15, wherein a resistance and a capacitance of said wire and a capacitance of said semiconductor components is calculated utilizing predetermined electrical characteristics and physical dimensions.

17. The computer program product according to claim 15, wherein said wires are segmented to allow buffer insertion prior to the insertion of each node.

18. The computer program product according to claim 15, wherein said wires and said semiconductor components comprise a fanout tree.

19. The computer program product according to claim 15, wherein said semiconductor components comprise transistors.

20. The computer program product according to claim 15, wherein said wire and said semiconductor components have a predetermined resistance and a predetermined capacitance.

* * * * *